US011264357B1

(12) United States Patent
Delacruz et al.

(10) Patent No.: US 11,264,357 B1
(45) Date of Patent: Mar. 1, 2022

(54) MIXED EXPOSURE FOR LARGE DIE

(71) Applicant: Invensas Corporation, San Jose, CA (US)

(72) Inventors: Javier A. Delacruz, San Jose, CA (US); Belgacem Haba, Saratoga, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 17/075,489

(22) Filed: Oct. 20, 2020

(51) Int. Cl.
*H01L 25/065* (2006.01)
*H01L 23/00* (2006.01)
*H01L 23/538* (2006.01)
*H01L 21/68* (2006.01)

(52) U.S. Cl.
CPC ............ *H01L 24/97* (2013.01); *H01L 21/682* (2013.01); *H01L 23/5384* (2013.01); *H01L 23/5389* (2013.01); *H01L 25/0655* (2013.01); *H01L 2225/06541* (2013.01)

(58) Field of Classification Search
CPC . H01L 24/97; H01L 23/5389; H01L 25/0655; H01L 21/682; H01L 23/5384; H01L 2225/06541
USPC ......................................................... 257/777
See application file for complete search history.

(56) References Cited

U.S. PATENT DOCUMENTS

| 5,418,687 | A | 5/1995 | Chen |
| 8,742,576 | B2 | 6/2014 | Thacker et al. |
| 9,472,529 | B2 | 10/2016 | Vora |
| 9,666,559 | B2 | 5/2017 | Wang et al. |
| 2015/0255417 | A1 | 9/2015 | Farooq et al. |
| 2016/0027761 | A1 | 1/2016 | Co et al. |
| 2018/0130784 | A1 | 5/2018 | Pagani |
| 2018/0337129 | A1 | 11/2018 | Li et al. |

FOREIGN PATENT DOCUMENTS

KR   20170109865 A   10/2017

OTHER PUBLICATIONS

U.S. Appl. No. 16/905,766, filed Jun. 18, 2020.
International Search Report and Written Opinon for PCT Application PCT/US2020/038642 dated Oct. 7, 2020, a counterpart foreign application for U.S. Appl. No. 16/905,766, pp. 1-pp. 13.

*Primary Examiner* — Elias Ullah
(74) *Attorney, Agent, or Firm* — Lee & Hayes, P.C.

(57) ABSTRACT

Techniques and arrangements for performing exposure operations on a wafer utilizing both a stepper apparatus and an aligner apparatus. The exposure operations are performed with respect to large composite base dies, e.g., interposers, defined within the wafer, where the interposers will become a part of microelectronic devices by coupling with active dies or microchips. The composite base dies may be coupled to the active dies via "native interconnects" utilizing direct bonding techniques. The stepper apparatus may be used to perform exposure operations on active regions of the composite base dies to provide a fine pitch for the native interconnects, while the aligner apparatus may be used to perform exposure operations on inactive regions of the composite base dies to provide a coarse pitch for interfaces with passive regions of the composite base dies.

22 Claims, 8 Drawing Sheets

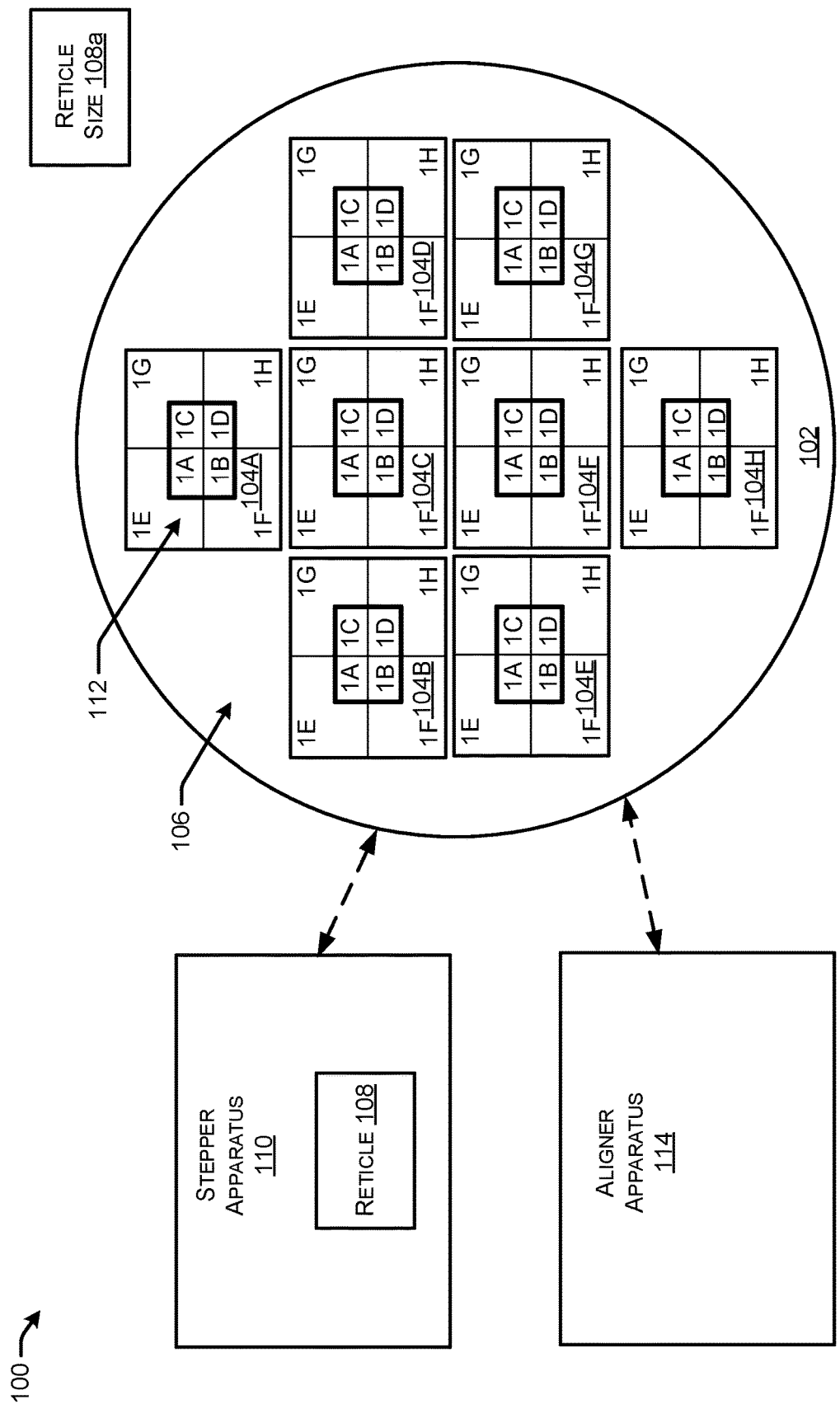

MIXED EXPOSURE FOR LARGE DIE

BACKGROUND

In microelectronic devices, electronic circuits are fabricated on a wafer of semiconductor material, such as silicon. The wafer with electronic circuits may be bonded to one or more other wafers, bonded to individual dies, or itself diced (singulated) into numerous dies, each die containing a copy of the circuit. Each die that has a functional integrated circuit is known as a microchip or "chip." When specific functions from a library of functions are assigned to individual chips, or when a large monolithic chip is emulated by a collection of smaller chips, these smaller chips, or chips with specific or proprietary functions, may be referred to as "chiplets." As used herein, unless otherwise indicated, chiplet means a complete subsystem (intellectual property core) (IP core), a reusable unit of logic, memory and/or other circuitry, on a single die. A library of chiplets may provide routine or well-established IP-block functions.

Large composite base dies, e.g., interposers, of microelectronic devices generally include multiple chiplets made up of multiple layers. The large composite dies may be defined within a wafer during manufacturing of the microelectronic devices.

In order to process the multiple layers, multiple mask sets are required. A stepper apparatus may be used to expose the multiple mask sets, layer by layer. However, often the reticle of the stepper apparatus is smaller than the size of the composite base die. Indeed, "large" generally refers to a base die that is bigger in area than the reticle. Thus, multiple passes of the wafer through the stepper apparatus are required and reticle stitching is needed. This is a time consuming and expensive process. Additionally, it can be possible to utilize multiple stepper apparatuses. However, stepper apparatuses are extremely expensive and thus, it is generally not practical to include multiple stepper apparatuses.

BRIEF DESCRIPTION OF THE DRAWINGS

The detailed description is set forth below with reference to the accompanying figures. In the figures, the left-most digit(s) of a reference number identifies the figure in which the reference number first appears. The use of the same reference numbers in different figures indicates similar or identical items. The systems depicted in the accompanying figures are not to scale and components within the figures may be depicted not to scale with each other.

FIG. 1 is a schematic diagram depicting an example illustrative layout of a wafer with composite base dies defined therein for use in microelectronic devices.

DESCRIPTION OF EXAMPLE EMBODIMENTS

Overview

Figure 2A:
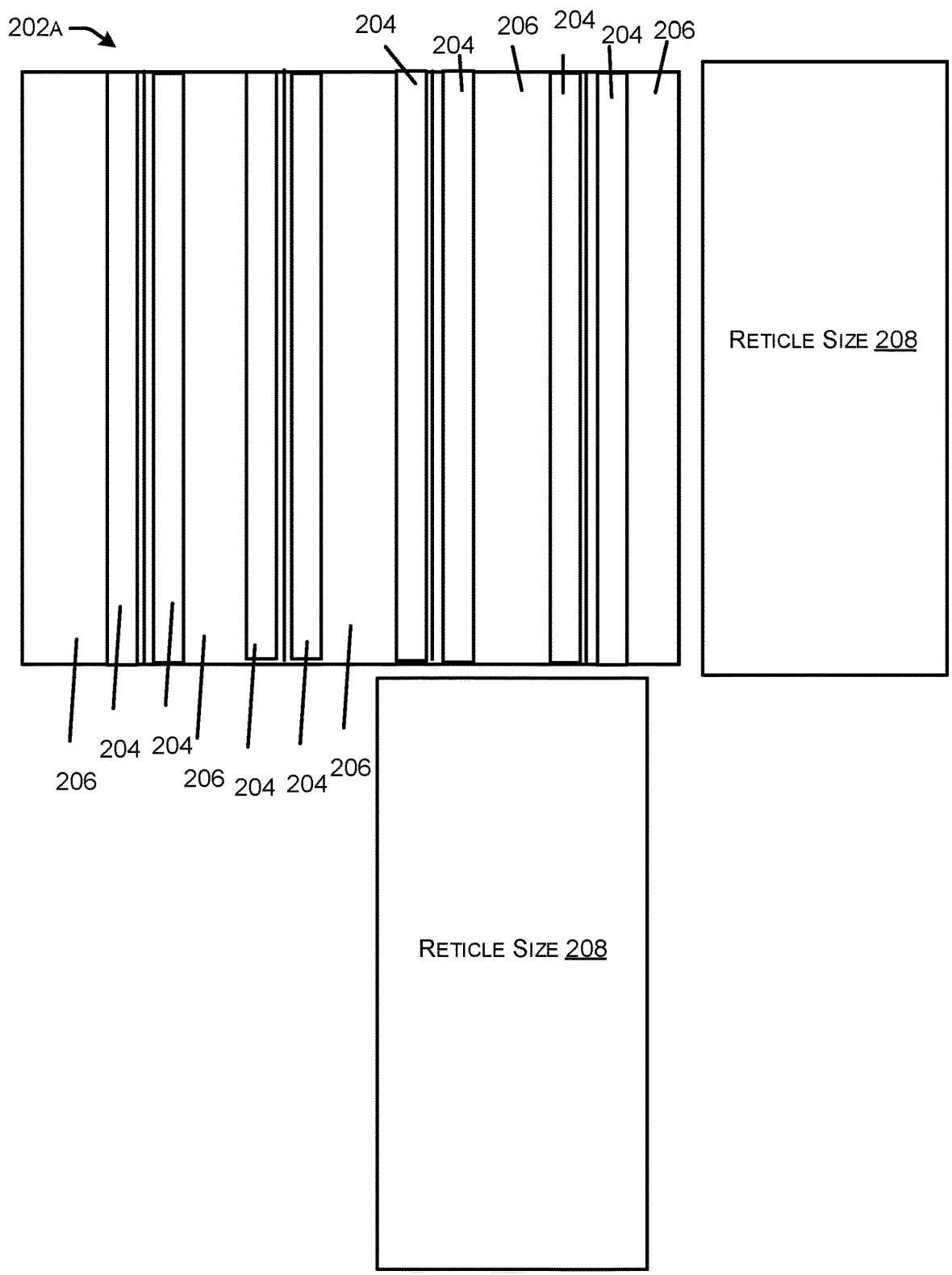
FIGS. 2A-2E schematically illustrate example alternative layouts of composite base dies with respect to active regions and inactive regions.
Figure 2B:
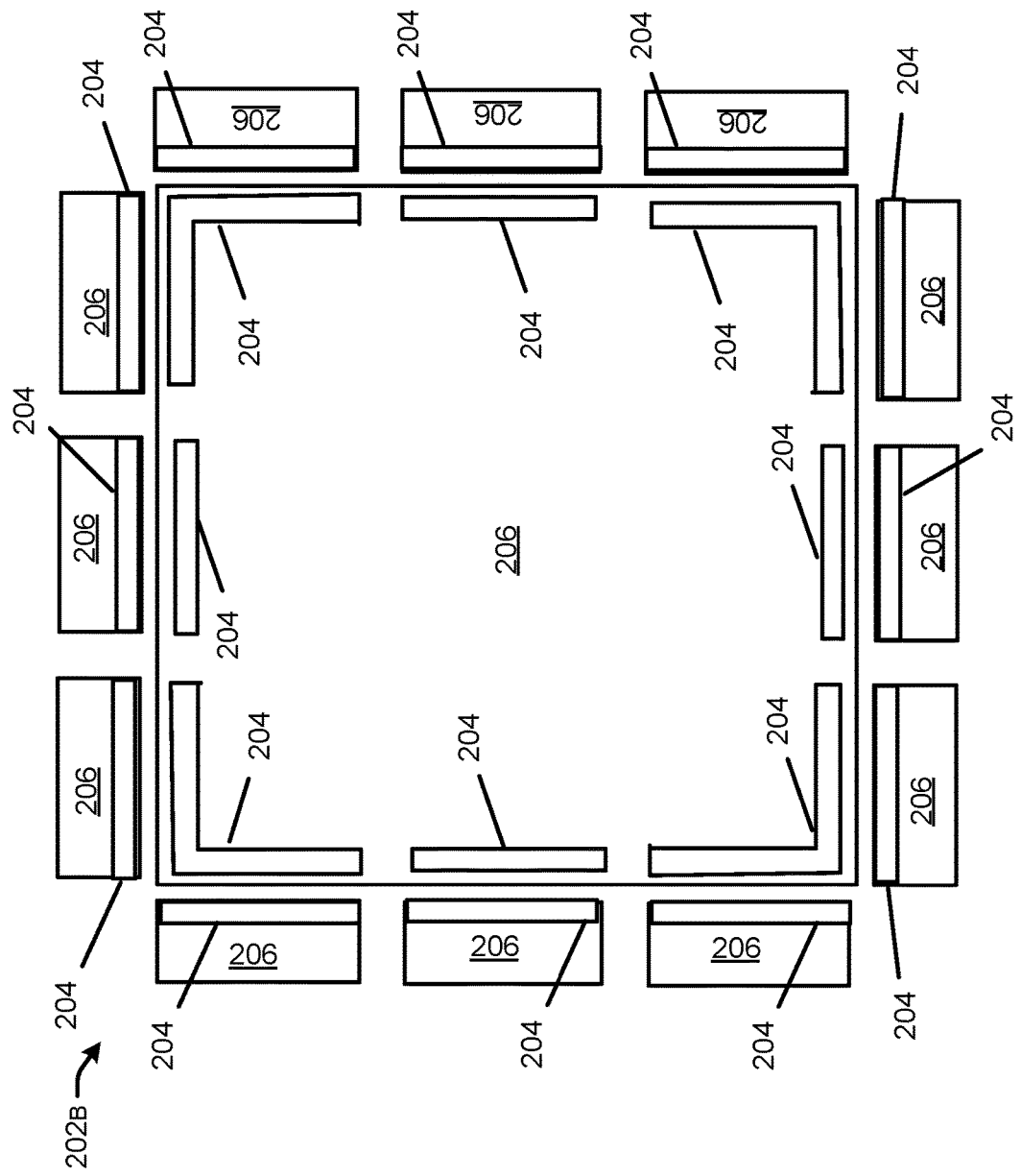
Figure 2C:
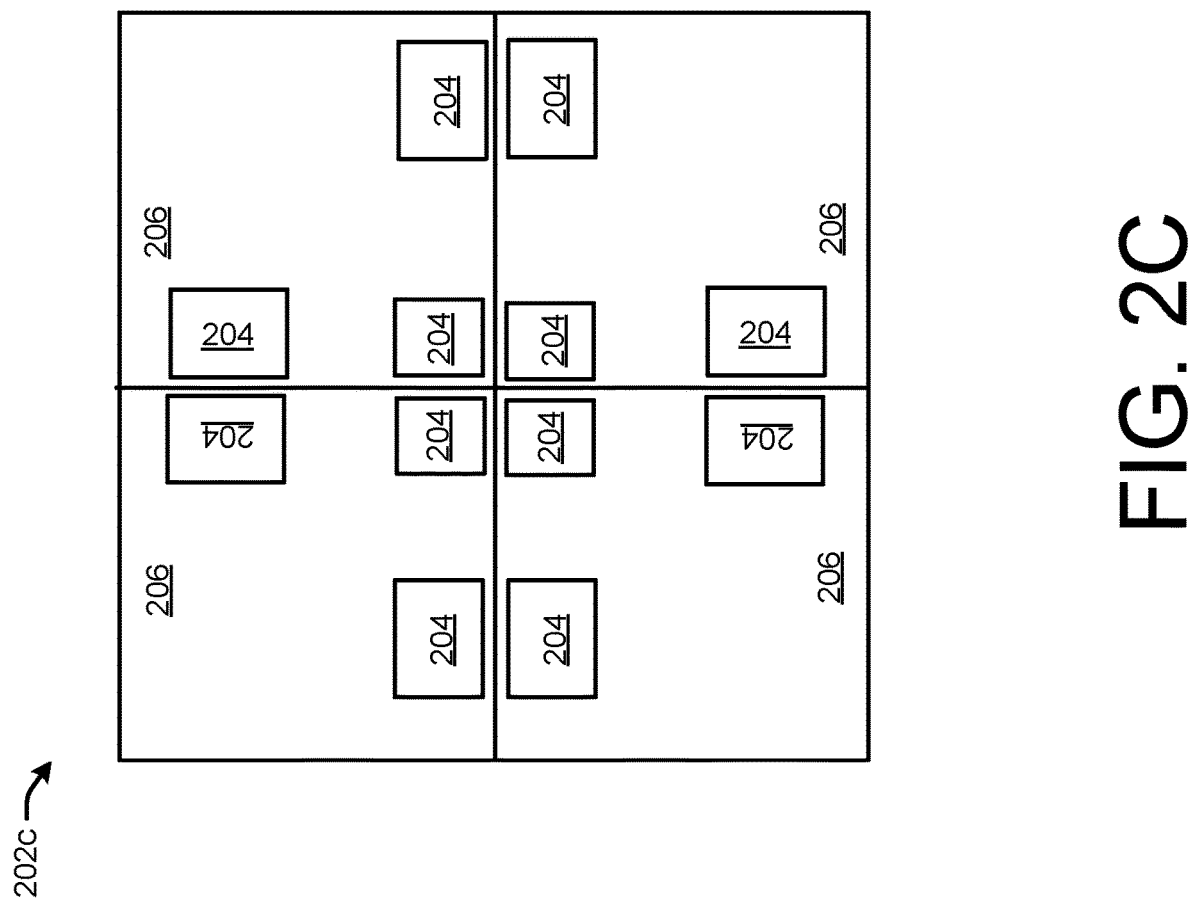
Figure 2D:
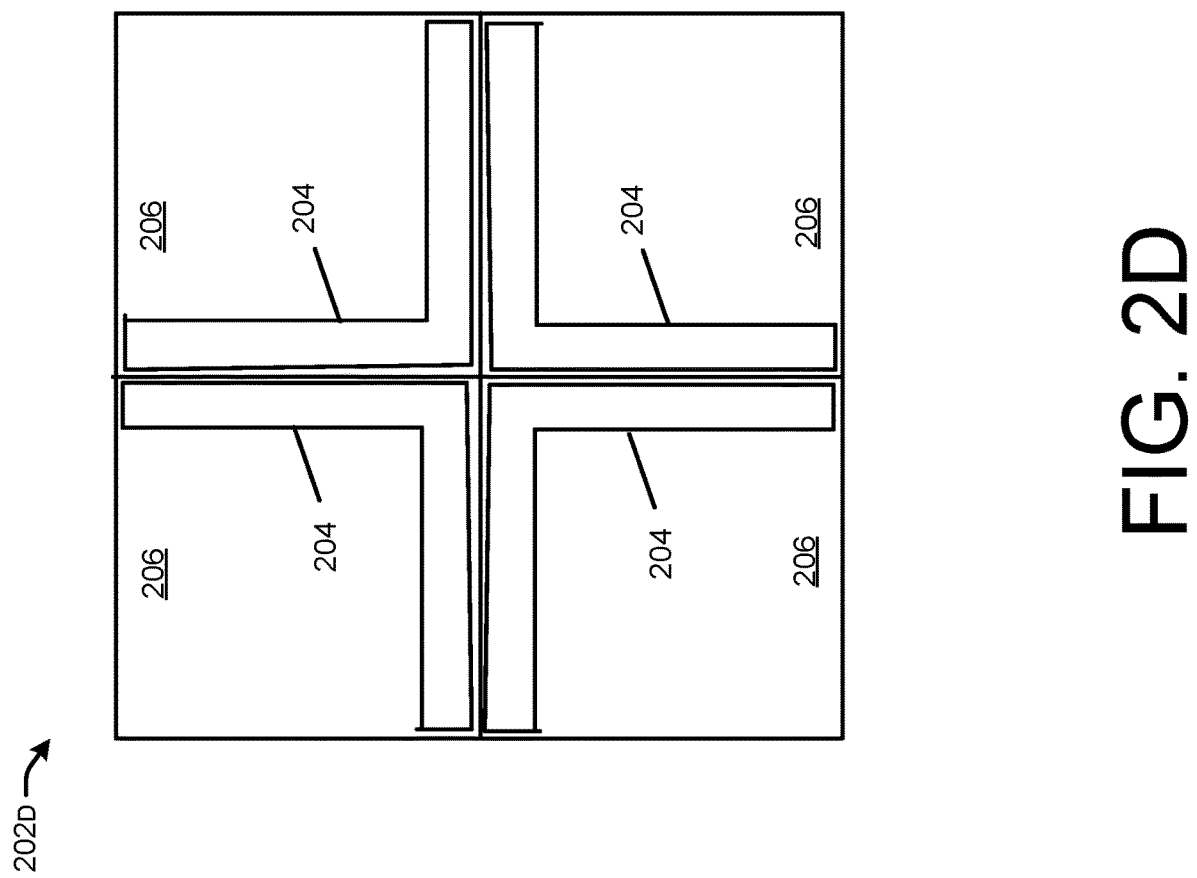
Figure 2E:
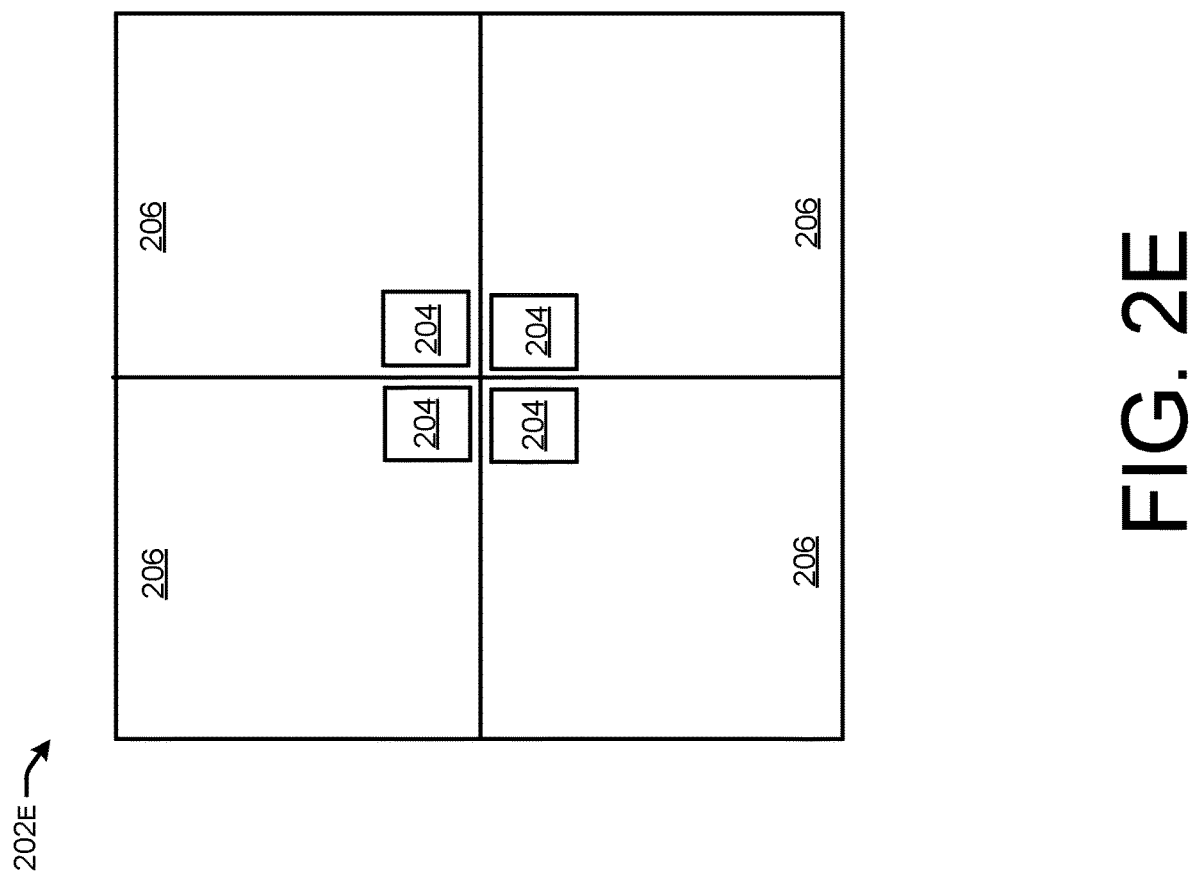

This disclosure describes example techniques and arrangements for performing exposure operations on a wafer utilizing both a stepper apparatus and an aligner apparatus. The exposure operations are performed with respect to large composite base dies, e.g., interposers, defined within the wafer, where the interposers will become a part of microelectronic devices by coupling with active dies or microchips. The composite base dies may be coupled to the active dies via "native interconnects" or "native interfaces" utilizing direct bonding techniques.

"Direct-bonding" as used herein means direct-contact metal-to-metal bonding, oxide bonding, or fusion bonding between two metals, such as copper to copper (Cu—Cu) metallic bonding between two copper conductors in direct contact, with at least partial crystal lattice cohesion. Such direct-bonding may be provided by a hybrid bonding technique such as DBI®. (direct bond interconnect) technology to be described below, and other metal bonding techniques (Invensas Bonding Technologies, Inc., an Xperi Corporation company, San Jose, Calif.). "Core" and "core-side" as used herein mean at the location, signal, and/or level present at the functional logic of a particular die, as opposed to at the location, signal, and/or level of an added standard interface defined by a consortium. Thus, a signal is raw or "native" if it is operational at the core functional logic level of a particular die, without certain modifications, such as additional serialization, added electrostatic discharge (ESD) protection except as inherently provided by the particular circuit; has an unserialized data path, can be coupled across dies by a simple latch, flop, or wire, has no imposed input/output (I/O) protocols, and so forth. A native signal, however, can undergo level shifting, or voltage regulation for purposes of adaptation between dies of heterogeneous foundry origin, and still be a native signal, as used herein. "Active" as used herein (active base die) accords with the usual meaning of active in the semiconductor arts, as opposed to "passive." Active components include transistor logic and amplifying components, such as the transistors. Passive components, on the other hand, do not introduce net energy into a circuit, and do not use an original source of power, except for power derived from other circuits connected to the passive circuit.

DBI bonding may be utilized for fine-pitch bonding in integrated circuit assembly, and can be applied to bond the die to the interconnect area. See for example, U.S. Pat. No. 7,485,968, which is incorporated by reference herein in its entirety. DBI bonding technology has also been demonstrated down to lower pitches in wafer-to-wafer approaches that do not have this individual die pitch limitation with the pick-and-place (P&P) operation (Pick & Place surface-mount technology machines). With DBI technology, under bump metalization (UBM), underfill, and micro-bumps are replaced with a DBI metalization layer. Bonding at die level is initiated at room temperature followed by a batch anneal at low temperature. ZiBond® direct bonding may also be used in some circumstances ((Ziptronix, Inc., an Xperi Corporation company, San Jose, Calif.).

In some configurations, the interconnects may be referred to as "direct-bonded native interconnects" that are metal-to-metal bonds formed directly between native conductors of a die and conductors of a second die, thereby forgoing the need for the complexity and overhead of standard interfaces. A native conductor of a die is an electrical conductor that has electrical access to the raw or native signal of the die, operational at the level of the core functional logic of the particular die, without significant modification of the signal for purposes of interfacing with other dies. The native interconnects for conducting such native signals from the core-side of a die can provide continuous circuits disposed through two or more cross-die boundaries without amplifying or modifying the native signals, except as desired to accommodate dies from different manufacturing processes. From a signal standpoint, the native signal of the IP core of one die is passed directly to other dies via the directly bonded native interconnects, with no modification of the native signal or negligible modification of the native signal, thereby forgoing standard interfacing and consortium-imposed input/output protocols. For example, the native interconnects described in U.S. Pat. No. 10,522,352, issued Dec. 31, 2019, entitled "Direct-Bonded Native Interconnects and Active Base Die", which is incorporated by reference in its entirety, may be utilized according to some configurations.

The composite base dies on the wafer include active regions and inactive (passive) regions. The use of native interconnects to couple a composite base die to an active die in a microelectronic device requires a fine pitch in the active regions of the composite base dies. For example, the active regions may require a pitch in a range of one to 10 microns. In some configurations, the pitch may be less than one micron. In other configurations, the pitch may be in a range of 10 to 100 microns. The inactive regions generally only require a pitch of 130 microns and above. In some configurations, the pitch in the inactive regions may be 100 microns and above.

In configurations, the stepper apparatus may be utilized to expose (e.g., perform a lithographic operation on) active regions of composite base dies on the wafer. Thus, for a first layer of the base die, the stepper apparatus may expose an active region of a first large composite die defined in the wafer. The reticle of the stepper apparatus may then be moved or "overstep" to a second composite base die defined in the wafer. The stepper apparatus may then expose active regions in the first layer of the second base die. The process may repeat until all of the composite base die active regions of all of the composite base dies defined in the wafer have been exposed in the first layer. In configurations, if multiple active regions fit within the stepper apparatus' reticle, then multiple active regions of a composite base die or composite base dies may be exposed and then the stepper apparatus may overstep and move the reticle to another set of active regions for exposure. In configurations, the aligner apparatus may be utilized to expose (e.g., perform a lithographic operation on) inactive regions of the composite base dies defined in the wafer. As is known, generally the wafer fits entirely within the aligner apparatus. Thus, all of the inactive regions of the composite base dies defined in the wafer may be exposed in the first layer with one single operation of the aligner. In some configurations, more than one aligner operation may be needed to expose all of the inactive regions of the composite base dies defined in the wafer. Use of both the stepper apparatus and the aligner apparatus results in no reticle stitching being required. Once the exposure operations have been performed in a layer, exposed areas may be etched.

Once the active regions and the inactive regions of the composite base dies defined in the wafer have been exposed and etched in the first layer, the process may be repeated for a second layer, a third layer, etc. Generally, other operations may be performed in addition to the exposure and etching operations of the various layers. For example, a resist may be applied to the layers of the wafer. In configurations, an antireflective coating may be applied to the entire wafer. The stepper apparatus may then be utilized to expose the active circuitry within the composite base dies as previously described. For example, the stepper apparatus may expose an active region within the first layer of a first composite base die and then the reticle may be moved, e.g., overstepped, to an active region of the second composite base die defined within the wafer. The stepper apparatus may then perform an exposure operation for the active region of the second composite base die. In configurations, the aligner apparatus may be used first to provide a pattern for alignment features for the stepper apparatus.

The wafer may then be processed using the aligner apparatus, e.g., the aligner apparatus may perform an exposure operation for the composite base dies defined in the wafer for the inactive regions, e.g., for the various features in the inactive regions including through silicon vias (TSVs). In configurations, TSVs in the active regions (via in the middle) may be exposed by the aligner apparatus. In some configurations, TSVs in the active regions (via in the middle) by the stepper apparatus in later exposure operations by the stepper apparatus.

After the aligner apparatus is used for exposure operations in the first layer, an etch/pattern operation may be performed by an appropriate apparatus. A cleaning operation may also be performed. In configurations, the first layer may be an implant layer and thus, implant operations may then be performed, e.g., a n-doping or a p-doping implantation operation may be performed. Masks may then be stripped and a further cleaning operation may then be performed. The process may then be repeated for a second layer, third layer, etc., depending on the number of implant layers. Once the implant layers are completed, then subsequent layers, e.g., metal layers, may be processed in a similar manner. In configurations, there may be additional operations performed not discussed herein. The operations discussed herein are merely examples and are not meant to be limiting.

Additionally, the order of the steps may be varied. For example, there could be negative or positive resists applied. Also, the stepper apparatus may expose active regions of a first layer and then the etching process may be performed for the exposed active regions in the first layer. The aligner apparatus may then expose inactive regions in the first layer and then the etching process may be performed before other operations are performed.

Example Embodiments

FIG. 1 is a schematic diagram 100 depicting an example illustrative layout of a wafer 102 with composite base dies 104a-104h (referred to herein singularly or collectively as 102) defined therein. In configurations, the wafer 102 may have more or fewer composite base dies 104 defined therein depending on the size of the composite base die 104. The composite base dies 104 include active regions 1A, 1B, 1C, and 1D that are located on a corner of each composite base die 102. Each composite die 104 also includes inactive regions 1E, 1F, 1G, and 1H. FIGS. 2A-2E schematically illustrate example alternative layouts of composite base dies 202a, 202b, 202c, 202d, and 202e with respect to active regions 204 and inactive regions 206, which correspond to active regions 1A, 1B, 1C, and 1D and inactive regions 1E, 1F, 1G, and 1H, respectively. As may be seen in FIG. 2E, the composite base dies 104 illustrated in FIG. 1 have a layout at least similar to the layout of composite base die 202e. However, the composite base dies 104 may have a different layout, including, but not limited to, the example layouts illustrated in FIGS. 2A-2D.

Referring back to FIG. 1, areas 106 of the wafer 102 that do not include any of the composite base dies 104 do not require exposure. Box 108a illustrates a reticle size of a reticle 108 of a stepper apparatus 110. As can be seen from box 106, the reticle 108 is larger than the sections 112 that include an active region and an inactive region, e.g., active region 1A and inactive region 1E, of the composite base dies 104, but the composite base dies 104 are larger than the reticle 108. Thus, the composite base dies 104 may be referred to as "large" composite base dies 104 since they are larger than the reticle 108.

In configurations, the stepper apparatus 110 may be utilized to expose (e.g., perform a lithographic operation on) just the active regions 1A, 1B, 1C, and 1D of the composite base dies 104 using the reticle 108. Thus, for example, the reticle 108 of the stepper apparatus 110 may be utilized to expose the active regions 1A, 1B, 1C, and 1D of the first composite base die 104a. As can be seen from box 106, the reticle 108 is sized such that the reticle 108 can expose all active regions 1A, 1B, 1C, and 1D of a composite base die 104a simultaneously. The stepper apparatus 110 may then overstep or move the reticle 108 to the next active regions 1A, 1B, 1C, and 1D of the second base die 104b, thereby leaving a space between exposures.

An aligner apparatus 114 may then be utilized to expose (e.g., perform a lithographic operation on) the inactive regions 1E, 1F, 1G, and 1H of the composite base dies 104. For example, portions of the inactive regions 1E, 1F, 1G, and 1H that may be utilized for metal fill for the backend of line (BEOL) layers of the composite base dies 104 may be exposed by the aligner apparatus 114. Furthermore, TSVs in the inactive regions 1E, 1F, 1G, and 1H may be exposed utilizing the aligner apparatus 114. Furthermore, power distribution routing may be exposed in the inactive regions 1E, 1F, 1G, and 1H utilizing the aligner apparatus 114. Additionally, minimal signal or clock routing between composite base dies 104 outside the active regions 1A, 1B, 1C, and 1D may also be exposed utilizing the aligner apparatus 114. The exposure operations performed by the stepper apparatus 110 and the aligner apparatus 114 occur layer by layer until all layers of the wafer 102 have been processed.

In configurations, there likely may be only one exposure per layer of the wafer 102 utilizing the aligner apparatus 114. However, in configurations, there may be two exposures utilizing the aligner apparatus 114 where the aligner apparatus 114 exposes both the metal fills and TSVs in a layer. Likewise, there generally is only one exposure of active regions 1A, 1B, 1C, and 1D for each composite base die 104 per layer of the wafer 102 utilizing the stepper apparatus 110. However, as previously noted, the stepper apparatus 110 exposes the active regions 1A, 1B, 1C, and 1D of the composite base dies 104 for each composite base die 104 defined within the wafer 102 individually, e.g., the reticle 108 is overstepped from one composite base die 104 to the next composite base die 104.

In configurations, depending on the size of the reticle 108 and the layout of the composite base die 104, multiple active regions 1A, 1B, 1C, and 1D of a composite base die 104 may be exposed simultaneously as is the case with the example of FIG. 1. For example, referring to back FIG. 2A, as may be seen, the reticle size 208 is big enough to expose active regions 202a and 202b simultaneously.

Thus, in configurations, a limited region of each composite base die 104 may be exposed utilizing the stepper apparatus 110 while other regions within the backend of line (BEOL) and optionally the frontend of line (FEOL), e.g., implants, early metal layers, utilize the aligner apparatus 114 for exposure. In configurations, the implants and early metal layers, or the FEOL, may utilize the stepper apparatus 110 to achieve a fine pitch.

Figure 3:
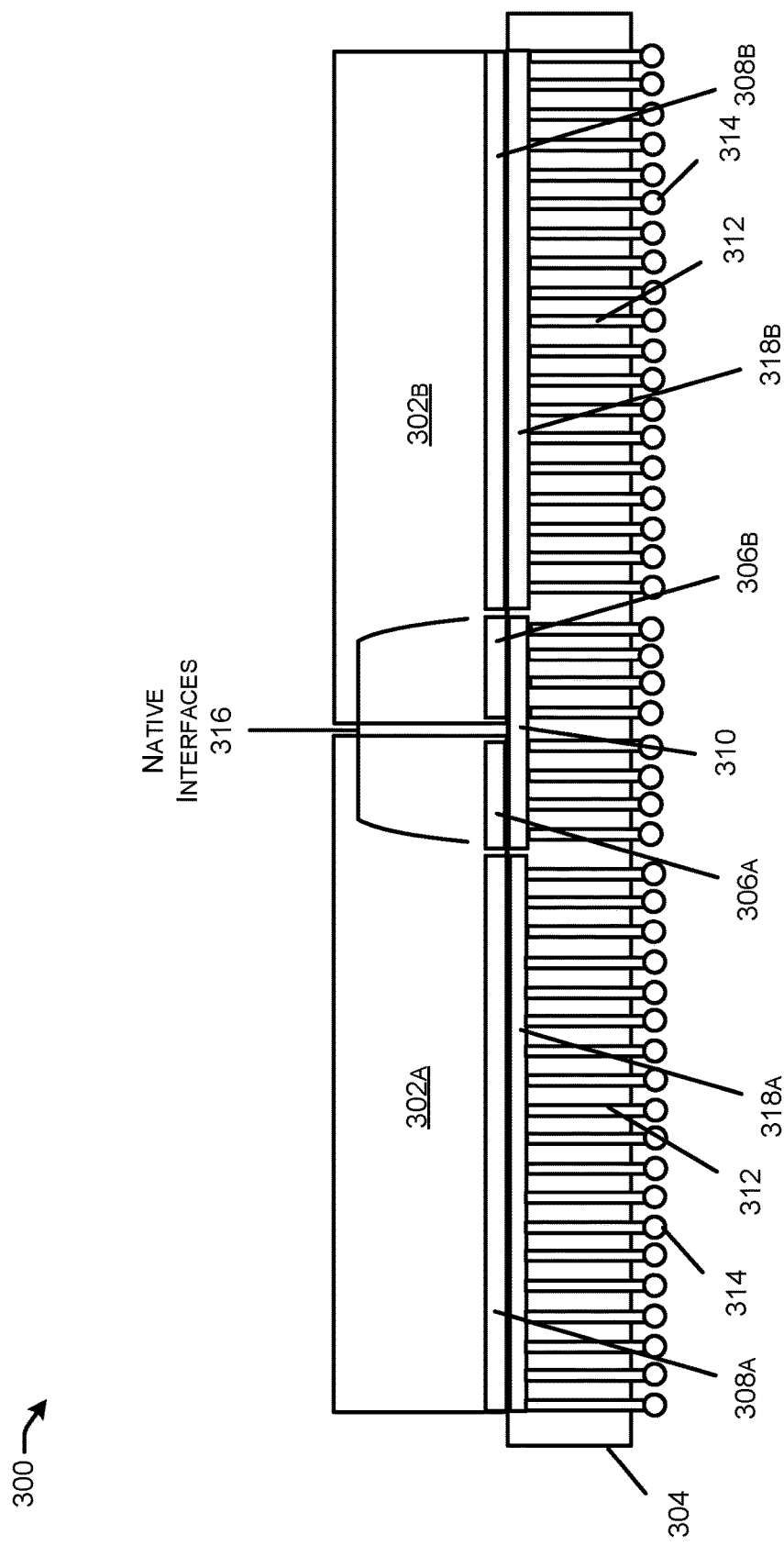
FIG. 3 schematically illustrates a cross-sectional view of an example of a microelectronic device that includes a composite base die.

FIG. 3 schematically illustrates a cross-sectional view of an example of a microelectronic device 300. The microelectronic device 300 includes active dies 302a, 302b located on a composite base die 304, e.g., an interposer corresponding to a composite base die 104 of FIG. 1. Regions 306a, 306b are active regions corresponding to active regions 1A, 1B, 1C, and 1D of FIG. 1. Regions 308a, 308b are inactive regions corresponding to inactive regions 1E, 1F, 1G, and 1H of FIG. 1. In configurations, a bridging area 310 may be provided in the composite base die 304 between the active regions 306a, 306b. The microelectronic device also includes TSVs 312 and bumps 314 to couple the microelectronic device 300 to, for example, a substrate, a circuit board, another microelectronic device, etc. (not illustrated).

As previously noted, the active regions 306a, 306b require a fine pitch to allow for native interfaces 316 between the active dies 302a, 302b and the composite base die 304. In configurations, other types of interfaces between the active dies 302a, 302b and the composite base die 304 at the active regions 306a, 306b may be utilized. Such other types of interfaces require a high density pitch however. The inactive regions 308a, 308b as previously noted, generally only require a conventional (coarse) pitch to interface with passive regions 318a, 318b of the composite base die 304. Such pitch is generally greater than 130 microns. In configurations, the pitch in the inactive regions 308a, 308b may be 100 microns to 130 microns. As previously noted, the fine pitch in the active regions 306a, 306b may be in a range of one micron to 10 microns. In some configurations, the fine pitch may be below one micron, while in other configurations, the fine pitch may be between 10 and 100 microns. Thus, interconnects in the active regions 306a, 306b on the composite base die 304 have a higher density, which is needed for native interfaces with the active dies 302a, 302b so that the composite base die 304 can handle driving the native interfaces. Thus, the stepper apparatus 110 is required to expose the various components in the layers of the active regions 306a, 306b, as previously discussed, since the stepper apparatus 110 can achieve the higher density while the aligner apparatus 114 generally cannot.

As previously noted, the inactive regions 308a, 308b, may have areas exposed in the various layers utilizing the aligner apparatus 114 (illustrated in FIG. 1). Examples of areas exposed in the various layers of the inactive regions 308a, 308b include, for example, pass throughs, metal fills (which may be utilized to balance the interposer), an optional power mesh to provide a robust power supply for the resulting microelectronic device 300, a minor routing to provide various signals, and "massive" passive components.

In configurations, the passive component comprises a capacitor. In other configurations, the passive component may comprise other devices, such as an inductor, a resistor, a voltage regulator, a filter, and/or a resonator. The passive component may be integrated into a layer of passive components (e.g., a massive number of passive devices) that is directly bonded to, for example, the actives dies 302a, 302b. In configurations, for example, the layer of passive components may be disposed in a layer of the composite base die 304 and may directly connect with the active dies 302a, 302b via the inactive regions 308a, 308b. The layer of passive components can thereby reduce the space occupied by passive components at the integrated device, at the package, and/or at the system board. Moreover, positioning the passive electronic component closer to active components of the active dies 302a, 302b may beneficially reduce overall inductance, which can improve the bandwidth and signal integrity of the semiconductor element, as compared with passive devices that are mounted to the package substrate or system board. In addition, the overall capacitance provided by the disclosed embodiments enables significantly higher capacitances (and reduced inductance) as compared with discrete passives mounted to a die. For example, the structures and techniques described in U.S. Patent Publication No. 2018/0190583A1, filed Feb. 7, 2017, entitled "Bonded Structures with Integrated Passive Component", which is incorporated by reference in its entirety, may be utilized according to some configurations.

Referring back to FIG. 1, in configurations, the aligner apparatus 114 may be utilized first to provide (pattern) for alignment features for the stepper apparatus 110. The stepper apparatus 110 may then be overstepped to expose only active regions 1A, 1B, 1C, and 1D or active circuitry as required. The stepper apparatus 110 is utilized layer by layer. The aligner apparatus 114 may be utilized for TSV locations in the active regions 1A, 1B, 1C, and 1D, e.g., "via in the middle." The stepper apparatus 110 may be utilized in configurations for the TSV locations, e.g., via in the middle, for only the active regions 1A, 1B, 1C, and 1D.

In configurations, the stepper apparatus 110 may be utilized for all active regions 1A, 1B, 1C, and 1D of a layer of the wafer 102 and then the aligner apparatus 114 may be utilized for the inactive regions 1E, 1F, 1G, and 1H at the layer of the wafer 102. In configurations, the process may be switched between the stepper apparatus 110 and the aligner apparatus 114 after several intermediate steps. For example, the stepper apparatus 110 may be utilized for exposure operations of active regions 1A, 1B, 1C, and 1D and then an etch operation may be performed by another component (not illustrated) on the exposed portions of the active regions 1A, 1B, 1C, and 1D. The aligner apparatus 114 may then be utilized for exposure operations of inactive regions 1E, 1F, 1G, and 1H and then an etch operation may be performed by another component (not illustrated) on the exposed portions of the inactive regions 1E, 1F, 1G, and 1H.

Thus, in some configurations, exposure steps may be performed and then another step may be performed or the steps may be alternated. For example, the stepper apparatus 110 may perform a lithography exposure operation on the active regions 1A, 1B, 1C, and 1D and then the aligner apparatus 114 may perform a lithography exposure operation on the inactive regions 1E, 1F, 1G, and 1H. An etch operation may be performed for all exposed areas in the active regions 1A, 1B, 1C, and 1D and the inactive regions 1E, 1F, 1G, and 1H. Alternatively, the stepper apparatus 110 may perform a lithography exposure operation on the active regions 1A, 1B, 1C, and 1D and then an etch operation may be performed on the exposed active regions 1A, 1B, 1C, and 1D. Then the aligner apparatus 114 may perform a lithography exposure operation on the inactive regions 1E, 1F, 1G, and 1H and then an etch operation may be performed on the exposed inactive regions 1E, 1F, 1G, and 1H.

Accordingly, as an example, the aligner apparatus 114 may be utilized first to pattern for alignment features for the stepper apparatus 110. Once the active regions and the inactive regions of the composite base dies 104 defined in the wafer 102 have been exposed and etched in a first layer, the process may be repeated for a second layer, a third layer, etc., of the wafer 102.

Generally, continuing with the example related to the first layer, other operations may be performed on the first layer in addition to the exposure and etching operations of the various layers of the wafer 102. For example, a resist may first be applied to the first layer of the wafer 102. In configurations, an antireflective coating may be applied to the entire wafer 102. The stepper apparatus 110 may then be utilized to expose the active circuitry within the composite base dies 104, as previously described. For example, the stepper apparatus 110 may expose active regions 1A, 1B, 1C, and 1D within the first layer of the first composite base die 104a and then the reticle 108 may be moved, e.g., overstepped, to active regions 1A, 1B, 1C, and 1D of the second composite base die 104b defined within the wafer 102. The stepper apparatus 110 may then perform an exposure operation for the active regions 1A, 1B, 1C, and 1D of the second composite base die 104b. This may be repeated for the active regions 1A, 1B, 1C, and 1D of the composite base dies 104c-104h.

The wafer 102 may then be processed using the aligner apparatus 114, e.g., the aligner apparatus 114 may perform an exposure operation for the composite base dies 104a-104h defined in the wafer 102 for the inactive regions 1E, 1F, 1G, and 1H, e.g., for the various features in the inactive regions 1E, 1F, 1G, and 1H including through silicon vias (TSVs). In configurations, TSVs in the active regions 1A, 1B, 1C, and 1D (via in the middle) may be exposed by the aligner apparatus 114. In some configurations, TSVs in the active regions 1A, 1B, 1C, and 1D (via in the middle) by the stepper apparatus 110 in later exposure operations by the stepper apparatus 110. In configurations, the TSVs may be continuous (one or more holes per net at a later step going through multiple dielectrics). In configurations, the TSVs may be disjointed with many offset vias at different diameters depending upon the layer of the wafer 102. Any given layer of the composite base die 102 may include many TSVs. Jumpers between sections of the active regions 1A, 1B, 1C, and 1D that connect active dies 302a, 302b of FIG. 3 of the microelectronic device 300 may be exposed by either the stepper apparatus 110 or the aligner apparatus 114 depending upon factors such as, for example, capability, cost, etc.

After the aligner apparatus 114 is used for exposure operations in the first layer, an etch/pattern operation may be performed by an appropriate apparatus. A cleaning operation may also be performed. In configurations, the first layer may be an implant layer and thus, implant operations may then be performed, e.g., a n-doping or a p-doping implantation operation may be performed. Masks may then be stripped and a further cleaning operation may then be performed. The entire process may then be repeated for a second layer, third layer, etc., depending on the number of implant layers. Once the implant layers are completed, then subsequent layers, e.g., metal layers, may be processed in a similar manner. In configurations, there may be additional operations performed not discussed herein. The operations discussed herein are merely examples and are not meant to be limiting.

Additionally, the order of the steps may be varied. For example, there could be negative or positive resists applied. Also, the stepper apparatus 110 may expose active regions of a first layer and then the etching process may be performed for the exposed active regions in the first layer. The aligner apparatus 114 may then expose inactive regions in the first layer and then the etching process may be performed before additional operations are performed.

In configurations, materials for the processes described herein may be dictated by the most demanding process, e.g., the stepper apparatus is the most likely apparatus to dictate the needed materials. For example, the stepper apparatus 110 may dictate the materials used in the other lithographic processes performed by the aligner apparatus 114. Additionally, the light source of the stepper apparatus 110 needs to be compatible with the mask materials in all lithographic steps.

Thus, in configurations, an antireflective coating may be placed on the wafer 102. Generally, the antireflective coating is placed over the entire top surface of the wafer 102. In configurations, in addition to or instead of the aligner apparatus 114, a direct imaging apparatus may be utilized for features in the inactive regions.

Figure 4:
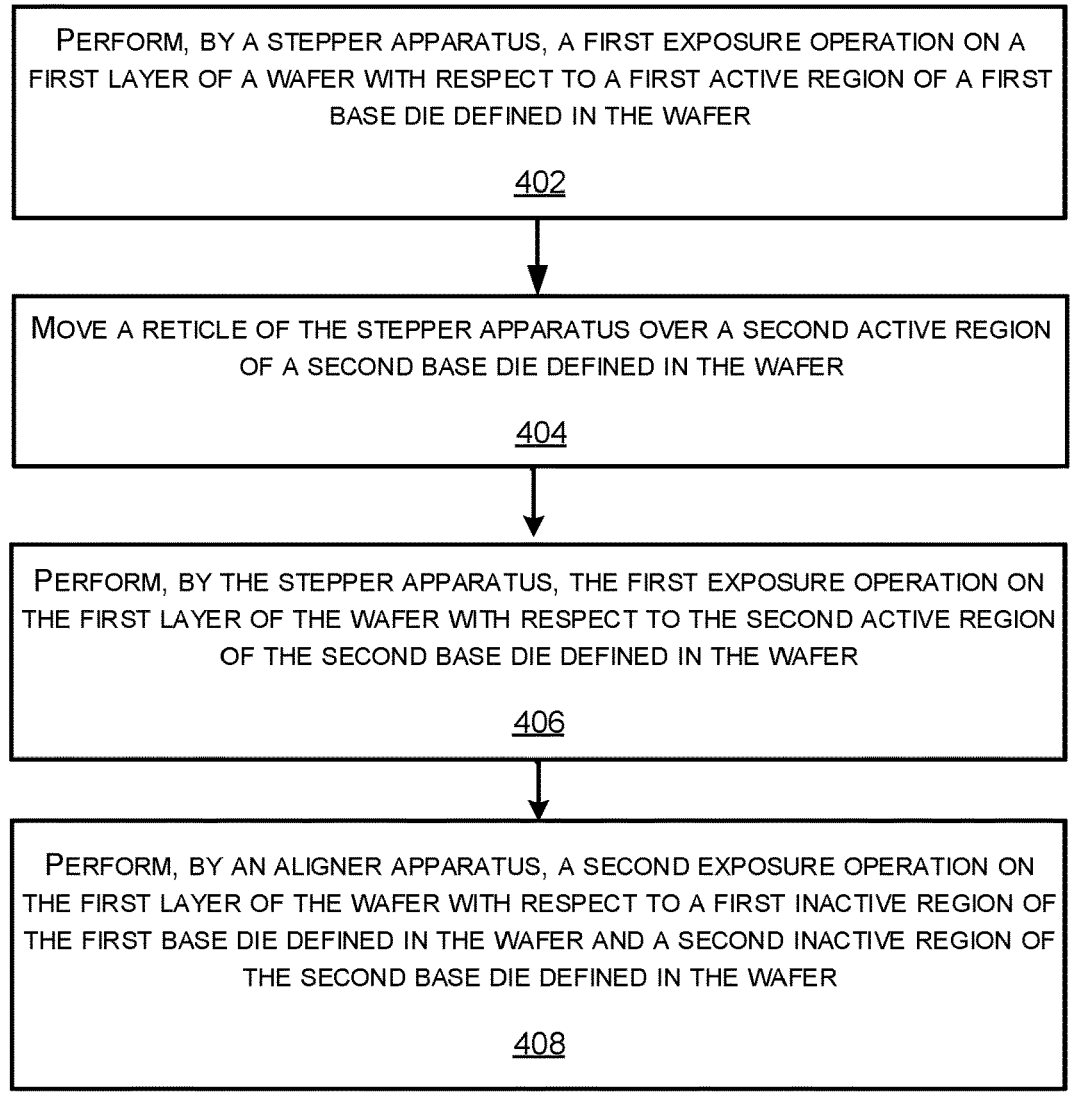
FIG. 4 illustrates a flow diagram of an example method for performing exposure operations on the wafer of FIG. 1 utilizing both a stepper apparatus and an aligner apparatus.

FIG. 4 illustrates a flow diagram of an example method 400 for performing exposure operations on a wafer utilizing both a stepper apparatus and an aligner apparatus. The exposure operations are performed with respect to large composite base dies or interposers, e.g., composite base dies 104, defined within the wafer, e.g., wafer 102, where the interposers will become a part of microelectronic devices, e.g., microelectronic device 300, by coupling with active dies or microchips, e.g., active dies 302a, 302b. In configurations, the composite base dies may be coupled to the active dies via "native interconnects" utilizing direct bonding techniques. In the flow diagram, the operations of method 400 are shown as individual blocks.

At block 402, a stepper apparatus may perform a first exposure operation on a first layer of the wafer with respect to a first active region of a first base die defined in the wafer. For example, the stepper apparatus 110 may perform a first exposure operation on a first layer of the wafer 102 with respect to the first active region, e.g., the active regions 1A, 1B, 1C, and 1D, of the first base die 104a defined in the wafer 102.

At block 404, a reticle of the stepper apparatus may be moved over a second active region of a second base die defined in the wafer. For example, the reticle 108 of the stepper apparatus 110 may be moved over the second active region, e.g., the active regions 1A, 1B, 1C, and 1D, of the second base die 104b defined in the wafer 102.

At block 406, the stepper apparatus may perform the first exposure operation on the first layer of the wafer with respect to the second active region of the second base die defined in the wafer. For example, the stepper apparatus 110 may perform the first exposure operation on the first layer of the wafer 102 with respect to the second active region, e.g., the active regions 1A, 1B, 1C, and 1D, of the second base die 104b defined in the wafer 102.

At block 408, an aligner apparatus may perform a second exposure operation on the first layer of the wafer with respect to a first inactive region of the first base die defined in the wafer and a second inactive region of the second base die defined in the wafer. For example, the aligner apparatus 114 may perform a second exposure operation on the first layer of the wafer 102 with respect to a first inactive region, e.g., the inactive regions 1E, 1F, 1G, and 1H, of the first base die 104a defined in the wafer 102 and a second inactive region, e.g., the inactive regions 1E, 1F, 1G, and 1H, of the second base die 104b defined in the wafer 102.

While the invention is described with respect to the specific examples and configurations, it is to be understood that the scope of the invention is not limited to these specific examples and configurations. Since other modifications and changes varied to fit particular operating requirements and environments will be apparent to those skilled in the art, the invention is not considered limited to the examples and configurations chosen for purposes of disclosure and covers all changes and modifications which do not constitute departures from the true spirit and scope of this invention.

Although the application describes configurations having specific structural features and/or methodological acts, it is to be understood that the claims are not necessarily limited to the specific features or acts described. Rather, the specific features and acts are merely illustrative of some embodiments that fall within the scope of the claims of the application.

What is claimed is:

1. A method comprising:
performing, by a stepper apparatus, a first exposure operation on a first layer of a wafer with respect to a first active region of a first base die defined in the wafer;
moving a reticle of the stepper apparatus over a second active region of a second base die defined in the wafer;
performing, by the stepper apparatus, the first exposure operation on the first layer of the wafer with respect to the second active region of the second base die defined in the wafer; and
performing, by an aligner apparatus, a second exposure operation on the first layer of the wafer with respect to a first inactive region of the first base die defined in the wafer and a second inactive region of the second base die defined in the wafer.

2. The method of claim 1, further comprising:
prior to the stepper apparatus performing the first exposure operation and the second exposure operation, providing, by the aligner apparatus, a pattern on the wafer for use by the stepper apparatus.

3. The method of claim 1, further comprising:
performing, by the stepper apparatus, a third exposure operation on a second layer of the wafer with respect to the first active region of the first base die defined in the wafer;
moving the reticle of the stepper apparatus over the second active region of the second base die defined in the wafer;
performing, by the stepper apparatus, the third exposure operation on the second layer of the wafer with respect to the second active region of the second base die defined in the wafer; and
performing, by the aligner apparatus, a fourth exposure operation on the second layer of the wafer with respect to the first inactive region of the first base die defined in the wafer and the second inactive region of the second base die defined in the wafer.

4. The method of claim 3, wherein:
the stepper apparatus performs the first exposure operation and then the aligner apparatus performs the second exposure operation; and
the stepper apparatus performs the third exposure operation and then the aligner apparatus performs the fourth exposure operation.

5. The method of claim 3, wherein the stepper apparatus performs the first and third exposure operations prior to the aligner apparatus performing the second and fourth exposure operations.

6. The method of claim 1, further comprising:
defining, by the aligner apparatus, through silicon vias (TSVs) in the first active region of the first base die;
defining, by the aligner apparatus, through silicon vias (TSVs) in the first inactive region of the first base die;
defining, by the aligner apparatus, through silicon vias (TSVs) in the first active region of the second base die; and
defining, by the aligner apparatus, through silicon vias (TSVs) in the first inactive region of the second base die.

7. The method of claim 6, wherein at least some of the TSVs are continuous.

8. The method of claim 6, wherein at least some of the TSVs are disjointed.

9. The method of claim 1, further comprising:
defining, by the stepper apparatus, through silicon vias (TSVs) in the first active region of the first base die; and
defining, by the stepper apparatus, through silicon vias (TSVs) in the second active region of the second base die.

10. The method of claim 1, further comprising:
performing, by a direct imaging apparatus, a third exposure operation on a third layer of the wafer with respect to the first inactive region of the first base die defined in the wafer and the second inactive region of the second base die defined in the wafer.

11. The method of claim 1, wherein the first base die and the second base die comprise interposers.

12. An arrangement comprising:
a stepper apparatus; and
an aligner apparatus,
wherein the arrangement is configured to perform actions comprising:
performing, by the stepper apparatus, a first exposure operation on a first layer of a wafer with respect to a first active region of a first base die defined in the wafer;
moving a reticle of the stepper apparatus over a second active region of a second base die defined in the wafer;
performing, by the stepper apparatus, the first exposure operation on the first layer of the wafer with respect to the second active region of the second base die defined in the wafer; and
performing, by the aligner apparatus, a second exposure operation on the first layer of the wafer with respect to a first inactive region of the first base die defined in the wafer and a second inactive region of the second base die defined in the wafer.

13. The arrangement of claim 12, wherein the actions further comprise:
prior to the stepper apparatus performing the first exposure operation and the second exposure operation, providing, by the aligner apparatus, a pattern on the wafer for use by the stepper apparatus.

14. The arrangement of claim 12, wherein the actions further comprise:
performing, by the stepper apparatus, a third exposure operation on a second layer of the wafer with respect to the first active region of the first base die defined in the wafer;
moving the reticle of the stepper apparatus over the second active region of the second base die defined in the wafer;
performing, by the stepper apparatus, the third exposure operation on the second layer of the wafer with respect to the second active region of the second base die defined in the wafer; and
performing, by the aligner apparatus, a fourth exposure operation on the second layer of the wafer with respect to the first inactive region of the first base die defined in the wafer and the second inactive region of the second base die defined in the wafer.

15. The arrangement of claim 14, wherein:
the stepper apparatus performs the first exposure operation and then the aligner apparatus performs the second exposure operation; and
the stepper apparatus performs the third exposure operation and then the aligner apparatus performs the fourth exposure operation.

16. The arrangement of claim 14, wherein the stepper apparatus performs the first and third exposure operations prior to the aligner apparatus performing the second and fourth exposure operations.

17. The arrangement of claim 12, wherein the actions further comprise:
defining, by the aligner apparatus, through silicon vias (TSVs) in the first active region of the first base die;
defining, by the aligner apparatus, through silicon vias (TSVs) in the first inactive region of the first base die;
defining, by the aligner apparatus, through silicon vias (TSVs) in the second active region of the second base die; and
defining, by the aligner apparatus, through silicon vias (TSVs) in the second inactive region of the second base die.

18. The arrangement of claim 17, wherein at least some of the TSVs are continuous.

19. The arrangement of claim 17, wherein at least some of the TSVs are disjointed.

20. The arrangement of claim 12, wherein the actions further comprise:
defining, by the stepper apparatus, through silicon vias (TSVs) in the first active region of the first base die; and
defining, by the stepper apparatus, through silicon vias (TSVs) in the second active region of the second base die.

21. The arrangement of claim 12, wherein the actions further comprise:
performing, by a direct imaging apparatus, a third exposure operation on a third layer of the wafer with respect to the first inactive region of the first base die defined in the wafer and the second inactive region of the second base die defined in the wafer.

22. The arrangement of claim 12, wherein the first base die and the second base die comprise interposers.

* * * * *